United States Patent
Meester et al.

[11] Patent Number: 5,686,359
[45] Date of Patent: Nov. 11, 1997

[54] TITANIUM SILICIDE PROCESS

[75] Inventors: Steven Glenn Meester, Middletown, N.J.; Arun Kumar Nanda, Austin, Tex.; Cletus Walter Wilkins, Scottsdale, Ariz.

[73] Assignee: Lucent Technologies Inc., Murray Hill, N.J.

[21] Appl. No.: 569,025

[22] Filed: Dec. 7, 1995

[51] Int. Cl.$^6$ .................................................. H01L 21/28
[52] U.S. Cl. .................................. 437/200; 437/192
[58] Field of Search .................................. 437/192, 200

[56] References Cited

U.S. PATENT DOCUMENTS

| | | | |
|---|---|---|---|
| 5,023,201 | 6/1991 | Standsolovich et al. | 437/200 |
| 5,043,300 | 8/1991 | Nulmon | 437/192 |
| 5,194,405 | 3/1993 | Sumi et al. | 437/200 |

FOREIGN PATENT DOCUMENTS 05259114  10/1993  Japan .

OTHER PUBLICATIONS

Mollardeau et al, "Characterization of TiSi$_2$ Ohmic and Schotticy Contacts Formed by Rapid Thermal Annealing Technology", J. Electrochem. Soc., vol. 136, No. 1, Jan. 1989, pp. 238–241.

S. Wolf, "Silicon Processing for the VLSI Era, vol. 2", Lattice Press, pp. 144–150, 1990.

*Primary Examiner*—Jey Tsai
*Assistant Examiner*—Thomas G. Bilodeau

[57] ABSTRACT

The specification describes a process for siliciding silicon metallization with titanium. The process requires two anneal steps and is based on careful control of operating parameters during the first anneal step. A prescription is given relating time and temperature of anneal, and titanium film thickness, to silicide resistivity. Proper choice of parameters also minimizes variables in the process.

1 Claim, 2 Drawing Sheets

TITANIUM SILICIDE PROCESS

FIELD OF THE INVENTION

The invention relates to silicide forming techniques useful in silicon integrated circuit processing.

BACKGROUND OF THE INVENTION

Polysilicon has been the key material in integrated circuit technology for many years due to its work function compatibility with silicon substrates, its refractory property that allows its use for self-aligned gates, and sufficient electrical conductivity to make it suitable for metallization. The conductivity of polysilicon can be enhanced by heavy doping but it remains marginal for modern VLSI technology. To further enhance the conductivity of polysilicon it is customary in advanced processing to silicide polysilicon gates and runners with titanium. The conductivity of titanium silicide is several times that of polysilicon.

Since polysilicon is still a material of choice due to its work function and ease of processing it remains as the basic material in silicon technology, and conductivity enhancement is realized by coating the polysilicon with titanium silicide. The conventional process is to pattern the polysilicon level, typically level one, blanket deposit titanium, heat to form titanium silicide, and remove unwanted titanium. The alternative of forming the silicide before patterning the polysilicon can also be performed, but removal of the unwanted material is more difficult due because titanium silicide is more difficult to etch than polysilicon. Other silicide materials are known and used, but titanium silicide is preferred due to its conductivity, adhesion to underlying poly, and ease and selectivity of removal.

In the preferred silicide process the anneal step used to form the silicide is performed in a rapid thermal anneal (RTA) apparatus. This anneal procedure is well known and is a descriptive process in its own right. In the silicide process according to this invention two RTA steps are used. The first (RTA 1) is a relatively low temperature anneal but is sufficient to form a phase of titanium silicide. Resistivity of this phase of titanium silicide is approximately 50 ohm cm. After selective removal of unreacted titanium a second RTA (RTA 2) step is performed at a higher temperature. This anneal converts the titanium silicide phase to a more stable phase with higher conductivity. Typically the conductivity of this phase is of the order of 15 ohm cm. We have discovered that the final conductivity of the titanium silicide material is most critically affected by the process parameters used in the first anneal (RTA 1) and that successful IC manufacturing process depends on good control of the first silicide anneal process.

The process parameters used in the first anneal combine to influence the conductivity of the silicide in complex ways. While broad ranges on each parameter can be independently developed and will yield reasonable results in terms of increasing the poly conductivity the mechanisms whereby they affect conductivity, and in particular the interrelationships between the parameters are not well understood. An understanding of these relationships would provide new process design capabilities leading to higher throughputs, low resistivity interconnects, and more reliability in IC processing.

STATEMENT OF THE INVENTION

According to this invention a parametric process specification has been developed that yields reliable and high level results. The process relies on critically controlling thickness of the deposited titanium layer, and the time and temperature of silicide formation during the first (RTA1) anneal. When these parameters are controlled according to the invention desired results are optimally obtained.

Figure 1:
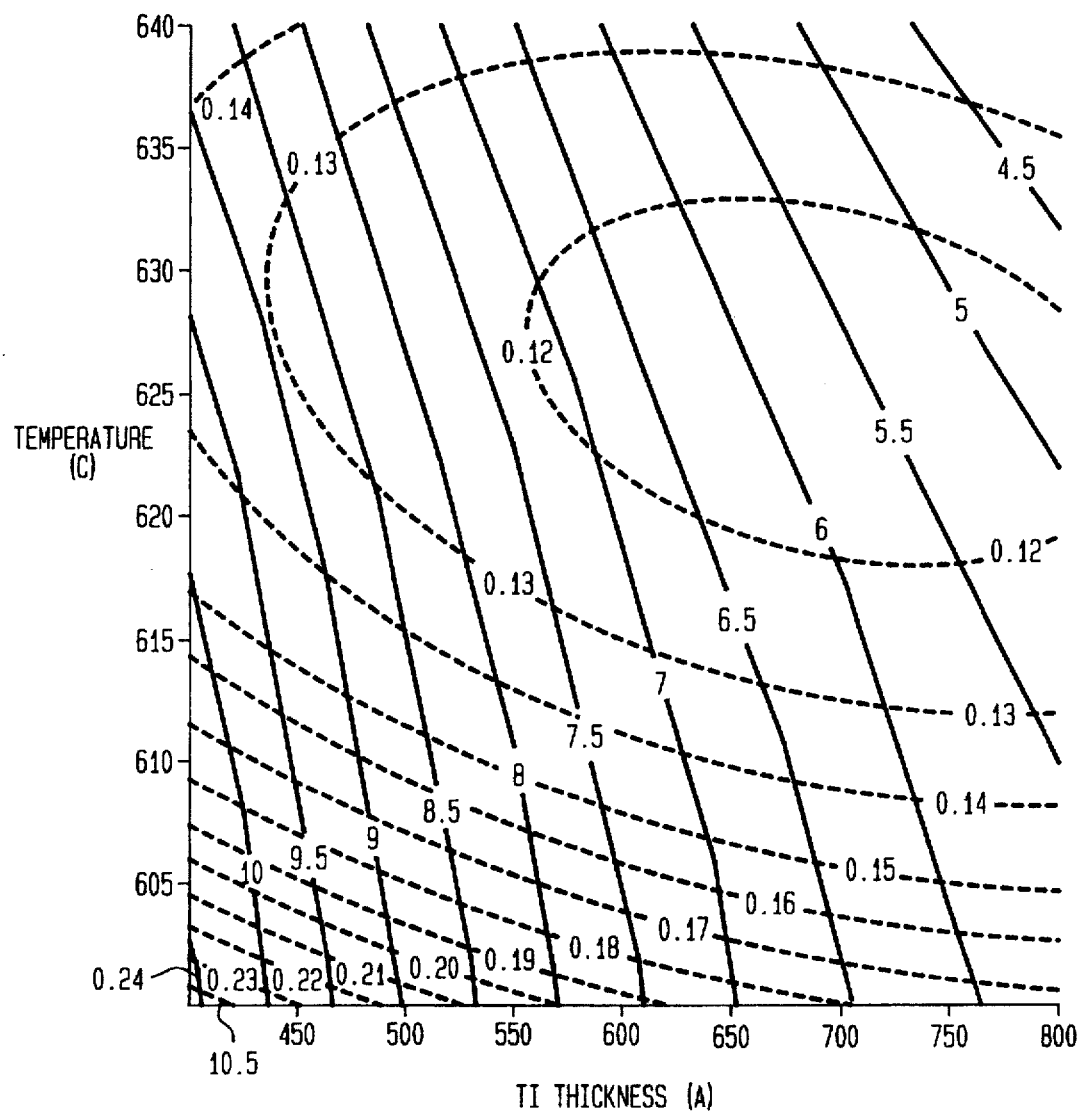
FIG. 1 is a response surface diagram for RTA1 temperature and initial titanium thickness.

DETAILED DESCRIPTION.

To explore the interrelationships referred to above we performed a series of experiments in which the key parameters were varied in a highly controlled fashion, keeping all other conditions constant. The sample wafers after appropriate processing were analyzed by measurement and analysis of sheet resistance. This was further augmented by Rutherford Back Scattering and/or X-ray diffraction data.

For effective siliciding the surface of the silicon must be clean and free of native oxide. Therefore the following procedure was followed on all sample wafers prior to deposition of titanium.

1. The SIF55 wafers were scribed on pad oxide and $Si_3N_4$ deposition. Oxide and nitride were removed by wet etch.

2. Scribed wafers were subjected to 5:1 Sulfuric Peroxide clean for five minutes and $N_2$ dry only.

3. Oxide was grown at 800° C. for 20 minutes in 100% $O_2$ ambient. This represents a growth of 50 to 60 Angstroms of oxide on the wafers.

4. The wafers were then subjected to 5:1 Sulfuric-Peroxide clean.

5. The oxide was etched off with 15:1 HF etchant. Overflow rinse was used to wash the wafers, and the wafers were dried in $N_2$ only dryers at room temperature. The wafers were moved to the titanium deposition step without any delay.

6. Titanium was sputter deposited using a Varian Model 3180 tool. The deposition temperature was kept at 300° C. and power at 70% of 3 kwh maximum. Deposition pressure was maintained at 7 mTorr with an argon back pressure of 1.5 mTorr. Thickness of titanium was changed by varying the deposition time only, while keeping all other parameters constant.

The objective of this work was achieving a target sheet resistance (dependent on the titanium film thickness associated with the technology) with minimum variability around the target, and maximum throughput (minimum anneal time). If all these objectives could not be met, film quality characterized by a uniform on-target film would take priority over throughput. Previous work had reduced the number of process parameters under consideration to three: thickness of titanium film, temperature of RTA1, and duration of RTA1. To meet the objective, a systematic characterization of the relationship between sheet resistance and the three process parameters was needed. A response surface design is the appropriate experimental design for the task, and a uniform precision central composite design was chosen (see D. Montgomery, "Design and Analysis of Experiment," 3rd ed., John Wiley, New York 1991). Table 1 contains the experimental runs in standard order. The run order was randomized for the actual experiment.

TABLE 1

| Run # | RTA1 Temp. (°C.) | RTA1 Duration (Seconds) | Ti Thickness (Ås) |
|---|---|---|---|
| 1 | 610 | 45 | 500 |
| 2 | 610 | 45 | 700 |
| 3 | 610 | 75 | 500 |
| 4 | 610 | 75 | 700 |
| 5 | 630 | 45 | 500 |
| 6 | 630 | 45 | 700 |
| 7 | 630 | 75 | 500 |
| 8 | 630 | 75 | 700 |
| 9 | 600 | 60 | 600 |
| 10 | 640 | 60 | 600 |
| 11 | 620 | 35 | 600 |
| 12 | 620 | 85 | 600 |
| 13 | 620 | 60 | 400 |
| 14 | 620 | 60 | 800 |
| 15–20 | 600 | 60 | 600 |

Wafers of p-type with a resistivity of 5–25 ohms-cm, (SIF55 wagers) were used for this experimental work. The sample wafers were prepared following the procedures described earlier. The thickness for titanium films reported in this work are based on the thicknesses as determined by Rutherford Back Sputtering (RBS) analysis. Normal bulk density of 4.52 gm/cc for titanium metal was used to calculate the thickness.

The Heatpulse (TM: AG Associate) System 4108 was used for the rapid thermal anneal steps. The temperature control was performed by an optical pyrometer. The optical pyrometer was calibrated with a K-type (Chromel-Alumel) thermocouple wafer, where the thermocouple junction was instrumented on the wafer. The pyrometer was calibrated over a temperature range of 300° C. to 1150° C., using the automatic calibration feature of the Advanced Temperature Processor (ATP). The emissivity of the sample wafers with titanium films on them was also determined by means of an Emissivity and Temperature Calibrator (ETC). The resulting values were programmed into the recipes that were created for RTA1 and RTA2 of the saliciding process.

The RTA 4108 reactor capacity is 3.0 liters, and the nitrogen gas flow was maintained at 5.0 liters per minute during the ramp and steady state operation. For purging, nitrogen at a rate of 20 liters per minute was used before and after anneal. The ramp rate was 75° C. per second while heating, and 50° C. per second while cooling down. Temperature and duration of the RTA1 step were kept at predetermined values as necessary for the central composite design.

After RTA1, all wafers were measured for sheet resistance by Prometrix Omnimap RS50/2. Sheet resistance for 49 sites on the wafer surface was measured with an edge exclusion of 10 mm. The average of the 49 sites was reported as the mean sheet resistance for the wafer, and the standard deviations were also calculated from these measurements.

Data analysis were accomplished using RS/Discover software (BBN Software Products Corporation, 10 Fawcett Street, Cambridge, Mass.). Response surfaces were fit to both the average within wafer sheet resistance and to the logarithm of the within wafer standard deviation. The response surfaces give a polynomial approximation to the functional relationship between the two responses and the process parameters.

The results of the measurements and calculations are summarized by the following relationship (equation 1):

$$\text{Average } \Omega/\square = -163.4 - 0.0294 \times \text{Thickness (Angstroms)} + \\ 0.637 \times \text{Temp. (°C.)} - 0.0154 \times \text{Time (sec)} + 1.4 \times 10^{-5} \times \\ \text{Thickness}^2 \text{ (Angstroms)}^2 - 5.5 \times 10^{-4} \times \text{Temp.}^2 \text{ (°C.)}^2 \quad (1)$$

All the terms in the model are statistically significant at 0.3% or lower. Individual significance levels are shown in Table 2a.

TABLE 2 a) LEAST SQUARES COEFFICIENTS, RESPONSE M (MEAN SHEET RESISTANCE)

| 0 Term | 1 Coeff. | 2 Std. Error | 3 T-Value | 4 Signif. |
|---|---|---|---|---|
| 1 1 | −163.432050 | 67.468014 | | |
| 2 T | −0.029369 | 0.001187 | | |
| 3 TE | 0.637067 | 0.217605 | | |
| 4 R | −0.015441 | 0.003325 | −4.64 | 0.0001 |
| 5 T**2 | 0.000014 | 8.749818E-07 | 16.47 | 0.0001 |
| 6 TE**2 | −0.000550 | 0.000176 | −3.13 | 0.0028 |

R-sq. = 0.9861   RMS Error = 0.2118
R-sq. adj. = 0.9848 b) LEAST SQUARES COEFFICIENTS, RESPONSE Slog_SIG (STANDAND DEVIATON)

| 0 Term | 1 Coeff. | 2 Std. Error | 3 T-Value | 4 Signif. |
|---|---|---|---|---|
| 1 1 | 279.369750 | 34.723165 | | |
| 2 T | −0.0151105 | 0.005530 | | |
| 3 TE | −0.883421 | 0.111827 | | |
| 4 T**2 | 0.000002 | 4.503599e-07 | 3.95 | 0.0003 |
| 5 TE**2 | 0.000695 | 0.000090 | 7.70 | 0.0001 |
| 6 T*TE | 0.000020 | 0.000009 | 2.29 | 0.0260 |

R-sq. = 0.7261   RMS Error = 0.1008
R-sq-adj. = 0.7012

T = THICKNESS OF TITANIUM FILM
TE = TEMPERATURE (RTA1)
R = TIME, SECONDS

A full quadratic model has been considered, and terms which were not statistically significant at the 5% level were dropped from the model.

The relationship between wafer variability and the process parameters considered may be approximated by the following polynomial (equation 2):

$$\log(\sigma) = 279.37 - 0.015 \times \text{Thickness (Angstroms)} - \\ 0.883 \times \text{Temp. (°C.)} + 2.0 \times 10^{-5} \times \text{Thickness (Angstoms)} \times \\ \text{Temp. (°C.)} + 2 \times 10^{-6} \times \text{Thickness}^2 \text{ (Angstroms)}^2 + \\ 7.0 \times 10^{-4} \times \text{Temp.}^2 \text{ (°C.)}^2 \quad (2)$$

All the terms in the model are statistically significant at 3% or lower with individual values given in Table 2b. Again a full quadratic model was considered and terms which were not significant at the 5% level were eliminated. Residual plots were investigated for the two models to assess model adequacy. Residuals were plotted against the predicted values, the individual predictors and against the run order. None of these residual plots indicated model inadequacy.

Note that time does not appear in the log (σ) expression. This suggests that over the region of investigation, anneal time does not have a significant effect on within wafer uniformity. This is an important and unexpected finding, and allows the process designer to choose short anneal times and high throughput knowing that process uniformity will not be compromised.

Figure 2:
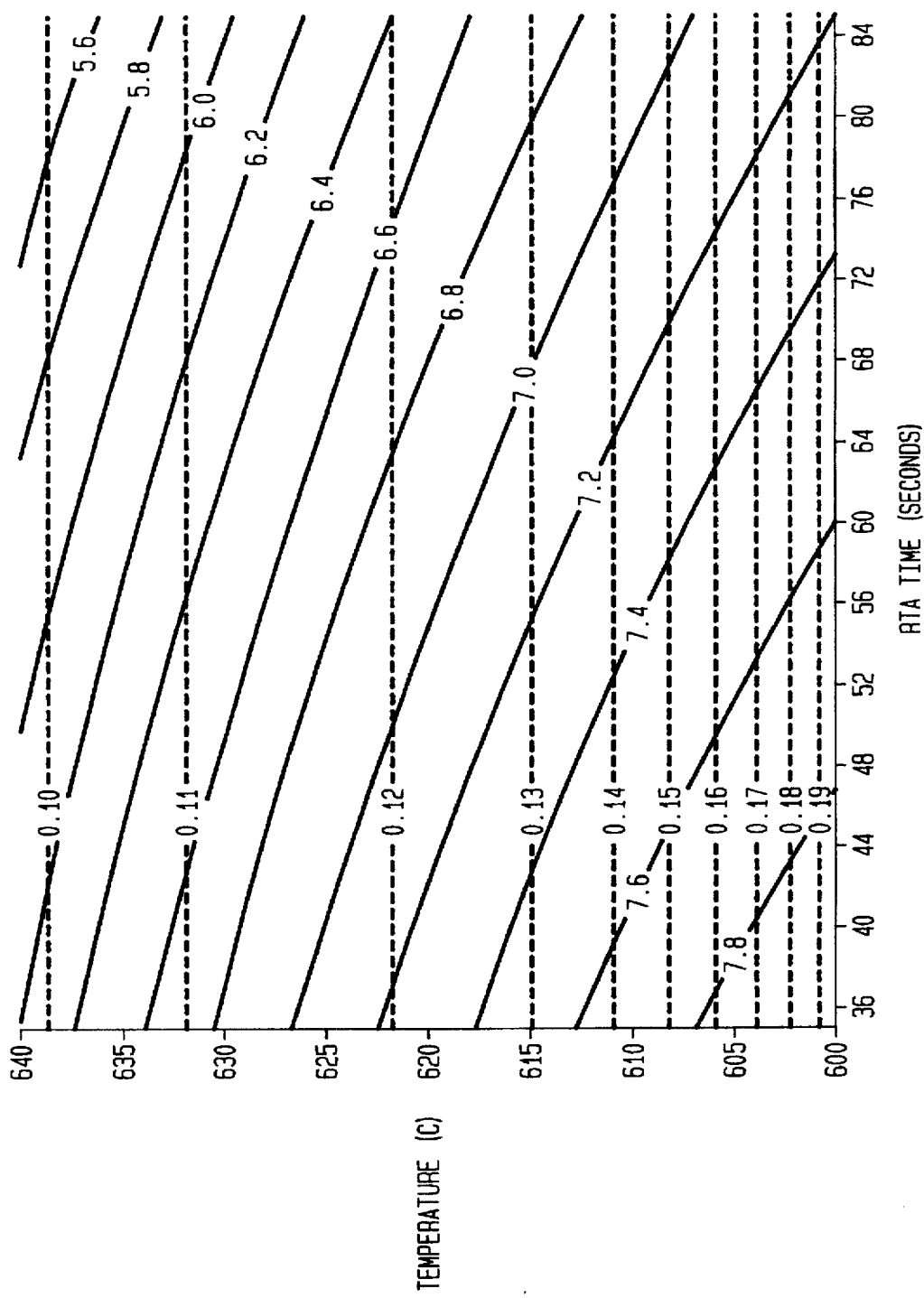
FIG. 2 is a response surface diagram for RTA1 temperature and duration of RTA1 anneal.

Using the polynomial models just discussed, contour plots were generated for a fixed time of 60 seconds. This plot is shown in FIG. 1. The primary axes plot temperature in °C.

vs Thickness in Angstroms. The solid contours (extending approximately vertically) show resistivity in ohms/cm² and the dashed contours show within wafer standard deviation. FIG. 2 is a contour plot describing the RTA1 temperature effect against RTA1 time for a fixed titanium thickness of 600 Angstroms. The contours represent the same parameters as in FIG. 1. For a titanium thickness of 600 Angstroms, the process specification for sheet resistance is 6.4±0.3 ohms/cm² which corresponds to 1000 Angstroms $TiSi_2$ after wet etch and RTA2. It can be seen from FIG. 2 that a minimum within wafer standard deviation can be achieved with a recipe with 627° C. and 74 seconds. The same target of 6.4 ohms/cm² may also be achieved using a recipe near 633° C. and 50 seconds. At this latter operating point a very modest sacrifice in within wafer uniformity has been made to improve throughput.

FIG. 1 shows that with anneal time fixed at 60 seconds, the within wafer standard deviation response surface is relatively flat for any titanium thickness if the anneal temperature is in the range 620°–640° C. The response surface for the mean sheet resistance may be used to choose an operating temperature to achieve the target sheet resistance for a given titanium thickness. The direction and distance between the contours for average sheet resistance indicate that average sheet resistance is not overly sensitive to temperature fluctuations. However, the average sheet resistance changes quite rapidly with titanium thickness at lower film thicknesses. This suggests that the thickness of thinner titanium films needs to be well controlled to reduce variability. With the benefit of equation (1) the process designer can select a target resistivity and determine the parameters that will reliably result in that resistivity. Equation (1) relates those parameters precisely, but small variations from those exact values may be used without departing from the spirit and scope of the invention.

We claim:

1. In the manufacture of silicon integrated circuits the method of forming titanium silicide on a silicon wafer containing polysilicon metallization comprising:

a. depositing a blanket layer of titanium having a thickness t on the silicon wafer thereby covering the polysilicon metallization on the wafer, b. annealing the wafer by a first rapid thermal annealing step to form $TiSi_2$ on the polysilicon metallization, leaving unreacted titanium on other portions of the wafer, said annealing step being performed at an anneal temperature T, and an anneal time S, c. etching away the unreacted titanium, and d. annealing the wafer by a second rapid thermal annealing step to decrease the resistivity of the $TiSi_2$, the invention characterized in that the thickness of the deposited titanium layer t in Angstroms, the anneal time t in seconds, the anneal temp. T in degrees Celcius, and the resistivity r in average ohms per square, are calculated using the relationship:

$$r = -163.4 - 0.0294t + 0.637T - 0.0154S + 1.4 \times 10^{-5} t^2 - 5.5 \times 10^{-4} T^2,$$

the invention further characterized in that the anneal temperature T has a value between 612 and 638 degrees Celcius, and r has a value between 4.5 and 8 ohms per square.

* * * * *